United States Patent [19]
Takeda et al.

[11] Patent Number: 6,097,280
[45] Date of Patent: Aug. 1, 2000

[54] FAULT LOCATOR THAT USES POSITIVE-PHASE-SEQUENCE ELECTRICITY

[75] Inventors: Akio Takeda; Yasuhiro Kurosawa, both of Tokyo, Japan

[73] Assignee: Kabushiki Kaisha Toshiba, Kawasaki, Japan

[21] Appl. No.: 09/399,098

[22] Filed: Sep. 20, 1999

[30] Foreign Application Priority Data

Jan. 20, 1999 [JP] Japan .................................. 11-012025

[51] Int. Cl.[7] ................................................ H04M 11/04
[52] U.S. Cl. .............................. 340/310.02; 340/310.06; 340/825.16
[58] Field of Search ......................... 340/310.01, 310.02, 340/310.06, 310.07, 825.16, 825.17; 370/247, 243; 375/124; 324/523

[56] References Cited

U.S. PATENT DOCUMENTS

| | | | |
|---|---|---|---|
| 3,586,968 | 6/1971 | Barjot | 324/523 |
| 4,077,004 | 2/1978 | Higo | 375/124 |
| 4,455,644 | 6/1984 | Fox et al. | 370/243 |
| 4,755,792 | 7/1988 | Pezzolo et al. | 340/310.02 |
| 5,352,957 | 10/1994 | Werner | 340/310.06 |

FOREIGN PATENT DOCUMENTS

8-233895  9/1996  Japan .
9-005384  1/1997  Japan .

*Primary Examiner*—Daniel J. Wu
*Attorney, Agent, or Firm*—Foley & Lardner

[57] ABSTRACT

A fault locator of a parallel transmission line includes a data receiving unit that receives the transmission and the received signal of each current differential relay provided with the transmission line, and measures the receiving timing of the transmission signal from a self-terminal. A fault detecting unit judges fault detection on the transmission line based on current data received with the data receiving unit, and outputs a starting signal. A data memory unit stores a predetermined fault generating range of a quantity of electric data of each self-terminal previously stored and an other side terminal when the quantity of electric data of each self terminal received with the data receiving unit and the other side terminal are stored and a starting signal is received. A synchronous correction unit, based on information on the receiving timing measured with the data receiving unit at the time of data reception of a self-terminal transmission signal, performs synchronous correction processing between each line to the stored memory. A setting unit inputs an impedance value and the line-length for three-phases as a setting value. A fault location unit performs fault location, using impedance setting for three-phases and line-length setting which were set with the stored memory data and the setting unit and the synchronous correction processing between each line that was performed in the synchronous correction unit.

10 Claims, 9 Drawing Sheets

FAULT LOCATOR THAT USES POSITIVE-PHASE-SEQUENCE ELECTRICITY

FIELD OF THE INVENTION

The present invention relates to a fault locator that performs a fault location by using a positive-phase-sequence electricity value based on a quantity of electricity about the positive-phase-sequence voltage and a quantity of electricity about each phase current of one terminal (self-terminal) and another terminal or terminals (the other side terminal or terminals), which are provided with a parallel transmission line, through a current differential relay such as a Pulse Code Modulation relay (hereinafter referred as PCM relay), which can get readily obtain data from all terminals connected on the parallel transmission line.

DESCRIPTION OF THE RELATED ART

A surge receiving system and a pulse radar system, for example, have been conventionally adopted as a fault location system of a transmission line.

With the surge system (hereinafter referred as system 1), the distance to a fault point is measured according to a transmission time-difference at both sides of the transmission line having a failure surge.

The pulse radar system (hereinafter referred as system 2) set off a pulse signal from the self-terminal when a fault occurs and the pulse return time from a fault point determines the fault point.

Moreover, an impedance measurement system has been applied in recent years.

In system 1 and system 2, signal coupling equipment is required for converting electric data to a predetermined level to be output to the transmission line. However, such signal coupling equipment is relatively expensive.

On the one hand, yet another system (hereinafter referred to as system 3) transforms the voltage and current, obtained by a voltage transformer and a current transformer, into digital data. System 3 measures a distance to the fault point based on an impedance obtained by using the digital data.

As to system 3, several systems are proposed: for example, Japanese Patent Publication No. 58-29471 describes a system to judge the fault location based on a voltage and a current of one terminal, and a fault locator of the transmission line.

An article by Mr.Houki and Mr.Kitani, published in 1957, by Ohm Company, describes a system to judge the fault point based on the voltage and the current of two terminals.

Generally, there is a system which uses the impedance measurement system of one-end fault location based on an equation given below, using a vector sum current of current data of each terminal obtained by a digital differential relay being equal to a fault current component.

Figure 8:
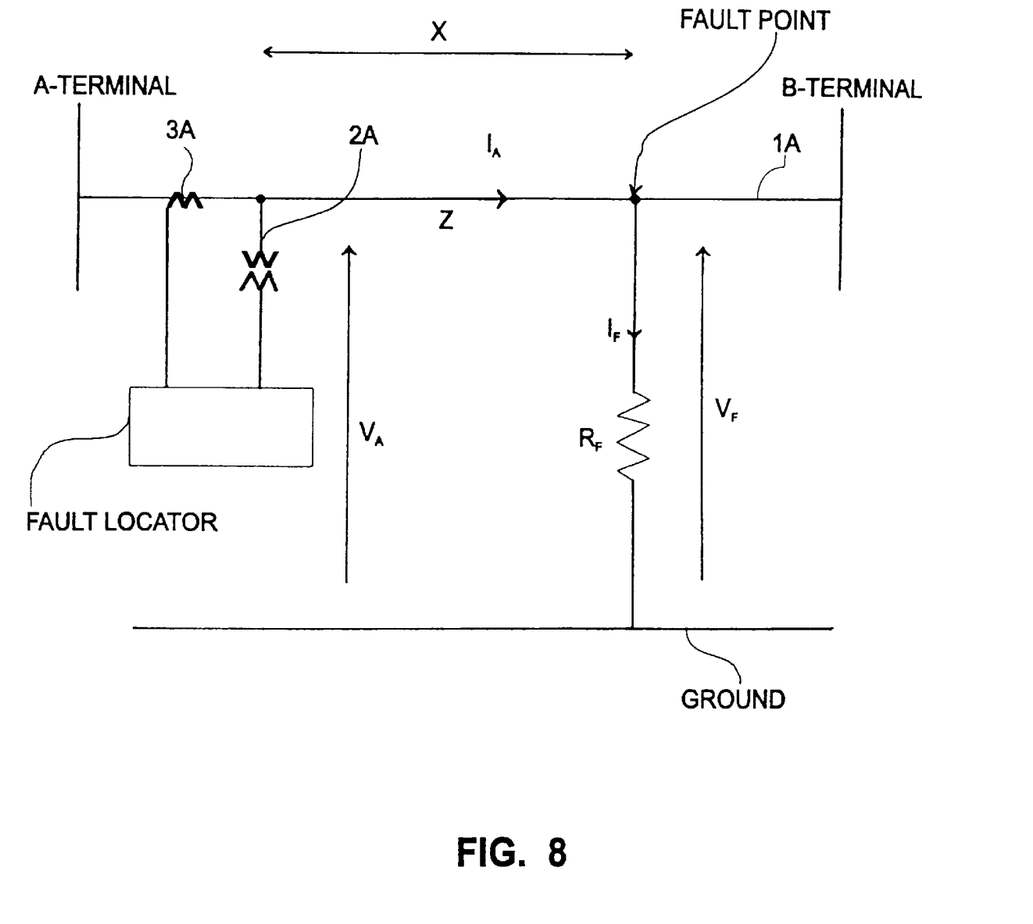
FIG. 8 is a system diagram showing a principle of an impedance measurement system.

FIG. 8 is a system diagram showing an impedance measurement system.

From FIG. 8, it is well known that the following equations are satisfied.

$$V_A = x \cdot z \cdot I_A + V_F \quad (1)$$

$$V_F = I_F \cdot R_F \quad (2)$$

$V_A$: voltage of A-terminal
$I_A$: current of A-terminal
$z$: impedance value per unit length of transmission line.

$V_F$: residual voltage of fault point
$I_F$: fault current
$R_F$: resistance of fault point (fault resistance)
x: measurement value (distance from A-terminal to fault point)

When $R_F$ is a real resistance component, an equation (3), given below, is satisfied, where:

*: denotes a conjugate component and Im{ }: denotes an imaginary component of { }.

A measurement value:x is given by an equation (4), based on equation (3).

$$I_m\{V_A \cdot I_F^*\}$$
$$= I_m\{x \cdot z \cdot I_A \cdot I_F^* + R_F \cdot I_F \cdot I_F^*\}$$
$$= I_m\{x \cdot z \cdot I_A \cdot I_F^*\} \quad (3)$$

$$x = [I_m\{V_A \cdot I_F^*\}]/[I_m\{z \cdot I_A \cdot I_F^*\}] \quad (4)$$

However, equation (4) is satisfied for a case where the resistance of the fault point is treated as a real resistance.

If the resistance of the fault point has a reactance component, $I_F$ and $V_F$ will not have the same phase. Therefore, since the equation (3) is not satisfied in that instance, a measurement error will occur.

If a voltage of the other side terminal is used to solve such the above-mentioned situation, the measurement value:x can be calculated, without being influenced by the remaining voltage of the fault point, by use of an equation (5).

$$V_A = x \cdot z \cdot I_A + V_F$$
$$V_B = (L-x) \cdot z \cdot I_B + V_F$$
$$x = (V_A - V_B + L \cdot z \cdot I_B)/[z \cdot \{I_A + I_B\}] \quad (5)$$

$V_B$: voltage of B-terminal
$I_B$: current of B-terminal
L: line length between A-terminal and B-terminal.

However, when using a current differential relay, a current and a voltage of all phases of the other side terminal are required to perform the fault location by using the equation (5).

Although the current data of the current differential relay should be just used, the voltage cannot be transmitted regarding all phases because of limitation of a data transfer rate.

For example, the transfer rate of a PCM relay, which is a typical other side terminal type relay, is 54 kbps, based on, for example, "Institute of Electrical Engineers of Japan paper magazine B (113 No. 2, Heisei 5)".

An actual example of transmission is indicated by reference (41-TOSHIBA REVIEW No. 11 "Digital current differential relay equipment for transmission line", November, 1986).

Figure 9:
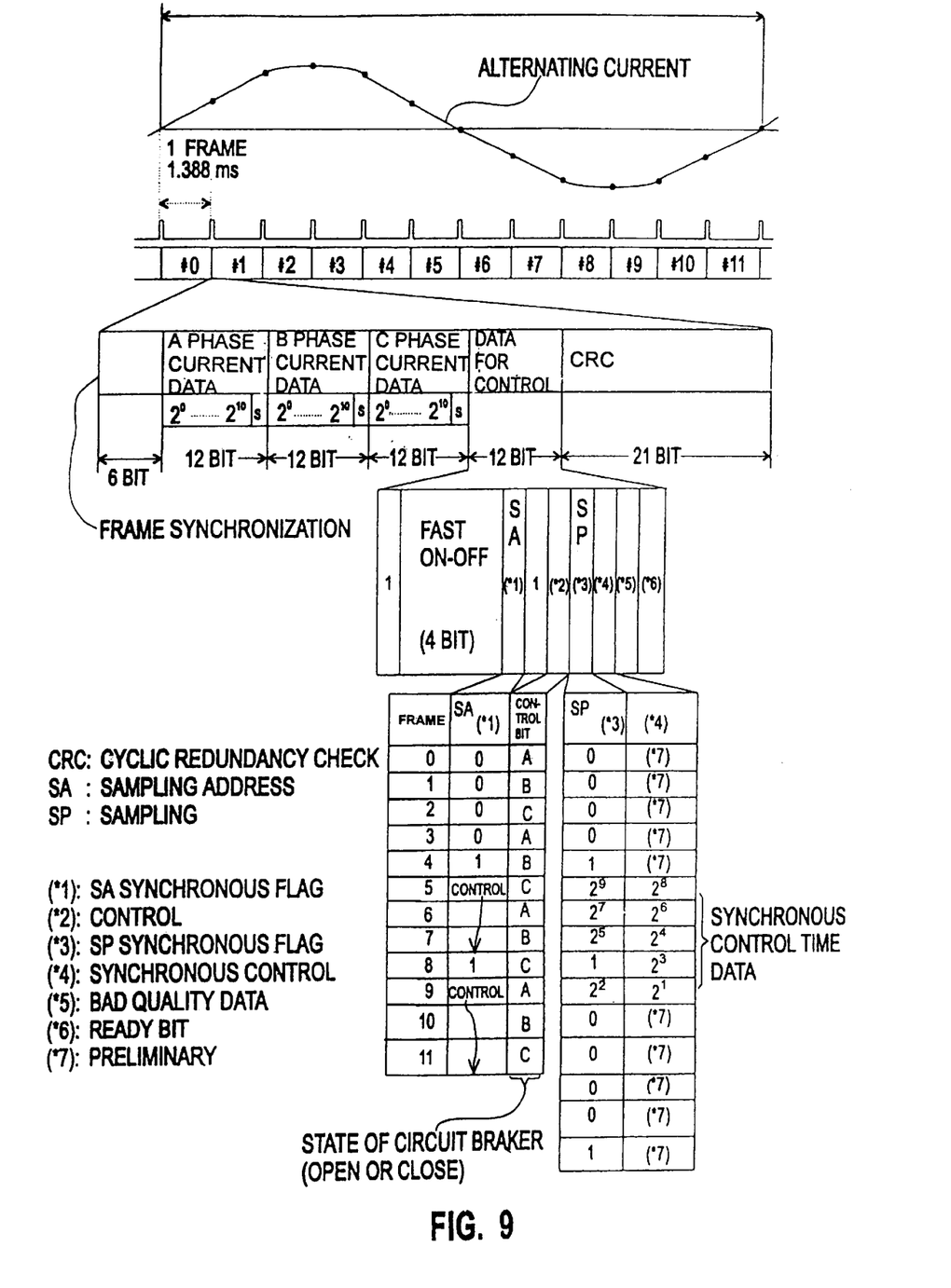
FIG. 9 is a transmission format showing a transmission system of a PCM relay.

Here, a portion of the above-mentioned reference is shown in FIG. 9. According to FIG. 9, each current data of three-phase (a, b, c) is transmitted within a time frame of three-phase* 12 bits/(1/720 Hz=1.388 ms). As voltage data, 4bit/(1/720 Hz=1.388 ms) is allocated.

Furthermore, in determining what is going to be treated as the quantity of each phase, the quantity of electricity for performing the fault location needs to be changed according to which phase is a fault phase.

For example, in the case of two phase fault and a ground fault, the phase-to-phase voltage and the phase-to-phase current need to be used.

Moreover, in the case of a single phase ground fault, a quantity of electricity of the ground fault phase needs to be used.

Since the function which sorts the fault phase for that purpose is needed, the necessity of sending out the quantity of electricity of all of the phases to the other side terminal is required.

Generally, to improve accuracy of calculation of performing the fault location, a correction is necessary, which takes into account an electromagnetic induction due to an adjacent line. Here, in the parallel transmission line structure, the other line is called the adjacent line with respect to the one line.

Namely, $(z \cdot I_A)$ part of a denominator in the equation (4) or $(z \cdot I_B)$ part and $[z \cdot (I_A + I_B)]$ part of a denominator in the equation (5) are calculated in a manner as given in equation (6). The equation (6) shows the case having an r-phase fault.

$$(z \cdot I)_r = z_{rr} \cdot I_r + z_{rs} \cdot I_s + z_{rt} \cdot I_t + z_{rr'} \cdot I_{r'} + z_{rs'} \cdot I_{s'} + z_{rt'} \cdot I_{t'} \quad (6)$$

$I_{r'}$, $I_{s'}$, $I_{t'}$: current of adjacent line r, s, t: three-phase $z_{rr}$: self impedance of r-phase of self line $z_{rs}$: mutual impedance of r-phase of self line influenced by s-phase of self line $z_{rt}$: mutual impedance of r-phase of self line t-phase of self line $z_{rr'}$: mutual impedance of r-phase of self line influenced by
r-phase of adjacent line $z_{rs'}$: mutual impedance of r-phase of self line influenced by s-phase of adjacent line $z_{rt'}$: mutual impedance of r phase of self line influenced by t phase of adjacent line That is, in order to perform an accurate fault location when taking into consideration the electromagnetic induction due to the adjacent line, the current data of the adjacent line is required. In other words, when a fault occurs on self line r-phase, a voltage drop of one line r-phase is influenced by fluctuation of another phase current (such as self line s-phase, self line t-phase, adjacent line r-phase, adjacent line s-phase, adjacent line t-phase).

However, as above-mentioned, when consideration is made in obtaining each voltage data and current data from each current differential relay provided with a line #10L and a line #20L, as a current differential relay is usually provided in accordance with the length per each line, sampling synchronization is not performed between each line #10L and #20L. Therefore, the voltage data and the current data cannot be used to perform the fault location in this case.

SUMMARY OF THE INVENTION

It is an object of the invention to provide a fault locator which overcomes the disadvantages of the related art described above.

It is a further object of the present invention provide the fault locator which improves the fault location by quantity of electricity of a minimum necessity, without sorting the fault phase.

To achieve these objects, this invention, for performing fault location on a parallel transmission line comprising a first line and a second line having a terminal at both sides, based on status of the parallel transmission line through a current differential relay provided with the terminals at both sides of said first line and said second line, comprising: a data receiving unit for receiving a transmission signal and a reception signal from said current differential relay provided with a first terminal of said terminals at both sides, measuring a receiving timing of said transmission signal from said current differential relay provided with said first terminal, wherein said transmission signal and said reception signal each includes said status of the parallel transmission line; a fault detecting unit for detecting a fault on said first line and said second line based on electrical data that includes said status of the parallel transmission line and said receiving timing from said data receiving unit, said fault detecting unit outputting a start signal when said fault is detected; a data memory unit for storing and updating said electrical data of said first line and said second line from said data receiving unit, storing said electrical data related to said fault when said start signal is outputted from said fault detecting unit, wherein said electrical data is related to said first terminal and an other side terminal that corresponds to a second terminal of said first line and said second line; a synchronous correction unit for performing a synchronous correction processing to said electrical data stored when said start signal is outputted, based on information on said receiving timing of said transmission signal from said data receiving unit; a setting unit for setting an impedance value of three-phases and a line-length of said first line and said second line as a setting value; a fault location unit for performing a fault location by using said electrical data after said synchronous correction processing by said synchronous correction unit, said impedance value of three-phases, and said line-length by said setting unit, wherein a measurement value obtained as a result corresponds to a distance to a fault point; and an output unit for outputting the measurement value.

BRIEF DESCRIPTION OF THE DRAWINGS

A more complete appreciation of the invention and many of the attendant advantages thereof will be readily obtained and better understood by reference to the following detailed description when considered in connection with the accompanying drawings.

DETAILED DESCRIPTION OF PREFERRED EMBODIMENTS

The present invention may be embodied in other specific forms without departing from the spirit or essential attributes therefore and, accordingly, reference should be made to the appended claims, rather than to the forgoing specification, as indicating the scope of the invention.

Figure 1:
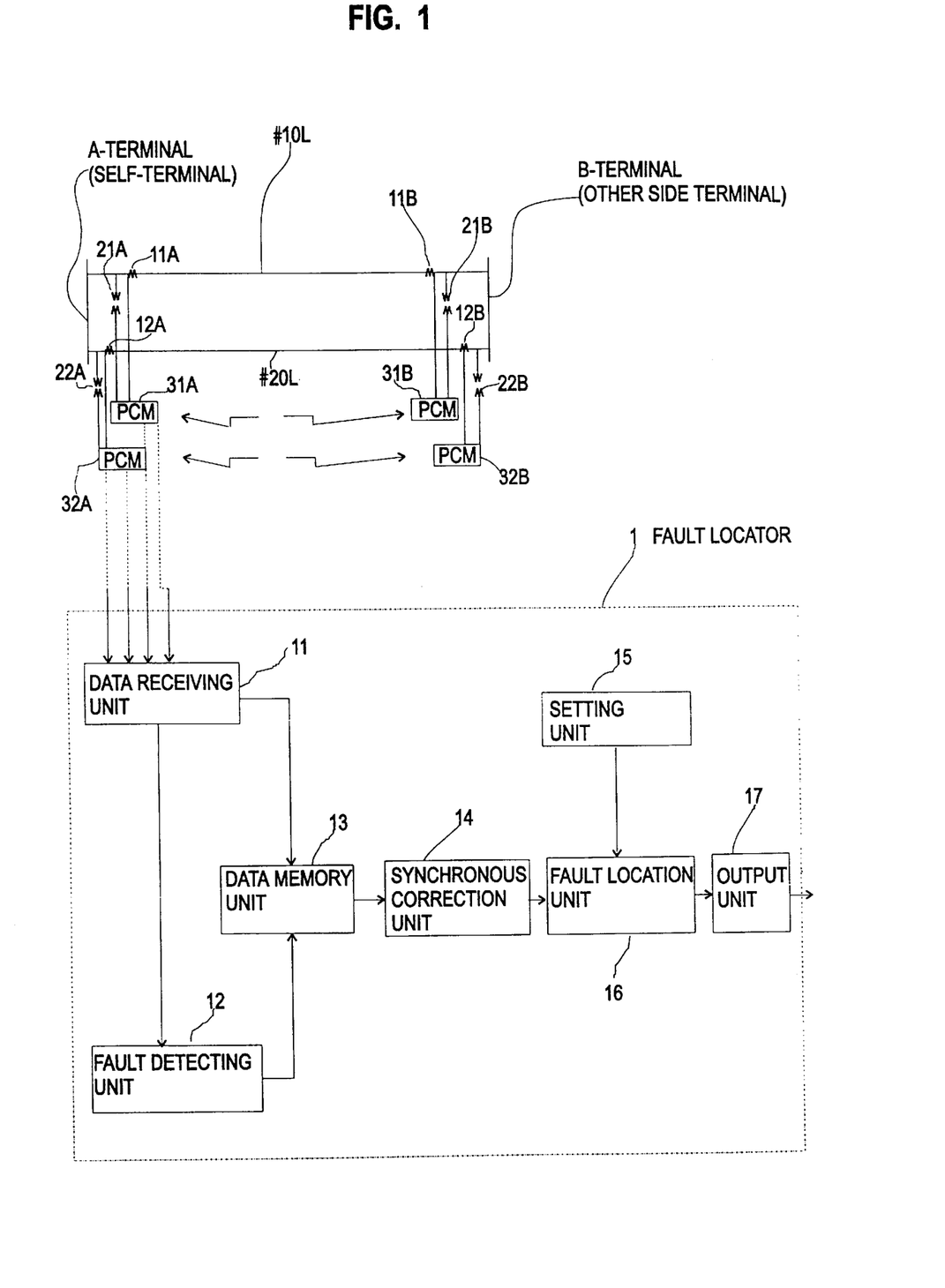
FIG. 1 is a functional block diagram showing a first embodiment of a fault locator according to this invention.

FIG. 1 is a functional block diagram showing a first embodiment of a fault locator according to the invention.

A #10L and a #20L respectively signify first and second lines of a parallel transmission line structure for which a fault location is desired to be found.

First, the side adjacent an A-terminal ("the self-terminal") will be explained.

PCM relays (31A, 32A) obtain current data and voltage data through current transformers (11A, 12A) and voltage transformers (21A,22A), which are provided with the side of the A-terminal (self-terminal).

Also, a quantity of electricity, such as the current data and the voltage data, is transmitted and received, where sampling synchronization is taken continuously with PCM relays (31B, 32B) provided with the side adjacent a B-terminal ("the other side terminal").

A fault locator 1 includes a data receiving unit 11, a fault detecting element 12, a data memory unit 13, a synchronous correction unit 14, a setting unit 15, a fault location unit 16 and an output unit 17.

Hereafter, each element of the fault locator 1 is explained briefly.

The data receiving unit 11 performs data reception from each PCM relay (31A, 31B).

The fault detecting unit 12 detects a fault based on data from the receiving unit 11.

The data memory unit 13 stores data from the data receiving unit 11 and the fault detecting unit 12, as stored data.

The synchronous correction unit 14 performs synchronous correction processing between lines (#10L, #20L).

The setting unit 15 sets up a setting value required for the fault location.

The fault location unit 16 performs the fault location.

The result output unit 17 provides an output in accordance with a result of the fault location unit 16.

Furthermore, each element is explained in more detail below.

The data receiving unit 11, by receiving 1 a self-transmission signal and a self-reception signal of the PCM relay 31A and a self-transmission and a self-reception signal of the PCM relay 32A, obtains the quantity of electricity for all terminals of a transmission line (#10L, #20L), at the same time, and measures the timing when a self-terminal transmission signal from each PCM relay (31A, 32A) is received.

The fault detecting unit 12 judges a fault detection, using the quantity of electricity received with the data receiving unit 11.

When the fault detection is performed, the fault detecting unit 12 outputs a start signal.

In addition, the fault detection itself can be considered in the various judgment methods that may be performed in accordance with the first embodiment.

For example, a differential current judging method which uses a quantity of electricity of all terminals, or an over-current judging which uses only a self-terminal quantity of electricity, can be considered.

It is preferable to apply the differential current judging method, in order to ensure an accurate internal fault judging method of the transmission line.

The data memory unit 13 stores and update previously stored data corresponding to the quantity of electricity of all terminals received with the data receiving unit 11, at a predetermined updating interval, and within a range of memory.

When the starting signal from the fault detecting unit 12 is received, information corresponded to the quantity of electricity for all terminals with a fault that has been written into the memory as a result of a previous starting signal is not overwritten in the memory, to allow for performing of the fault location.

Generally, a PCM relay is dependently provided with each line shown in FIG. 1. That is, the sampling synchronization is taken between a self-terminal and other side terminal in the same line, for example, between the PCM relay 31A and the PCM relay 31B, or between the PCM relay 32A and the PCM relay 32B.

However, between the PCM relay 31A provided with the line #10L and the PCM relay 32A provided with the line #20L, a sampling synchronization is not taken, and an asynchronous relation between those two results.

For this reason, if the data for all terminals by which memory preservation is performed with the data memory unit 13 remain, the fault location cannot be performed.

The synchronous correction unit 14 performs a synchronous correction processing between the quantity of electricity on the line #10L and the quantity of electricity on the line #20L, based on information on the receiving timing measured at the time of the self-terminal transmission signal reception from each PCM relay (31A, 32A) through the data receiving unit 11.

For example, when the receiving timing difference of the self-terminal transmission signal from the PCM relay 31A on the line #10L and the PCM relay 32A on the line #20L is "θ", the quantity of electricity received from the PCM relay 32A on the line #20L can be transformed into a data series which is sampled at the sampling timing of the PCM relay 31A on the line #10L, by using equations (7-1), (7-2).

$$v_{2m} = v_{2n} \cos\theta - (\sqrt{3}v_{2n} - 2v_{2n-1})\sin\theta \qquad (7\text{-}1)$$

$$i_{2m} = i_{2n} \cos\theta - (\sqrt{3}i_{2n} - 2i_{2n-1})\sin\theta \qquad (7\text{-}2)$$

$v_{2m}$, $i_{2m}$: sampling value of current data and voltage data of #20L m: sampling time series equivalent to line #10L side.

n: sampling time series data at the time of receiving from a data collector of line #20L.

The setting unit 15 sets an impedance value for three-phases of the line #10L and the line #20L required for the fault location as a setting value, and sends the setting value to the fault location unit 16.

In addition, with this fault locator, the electric quantity of the positive-phase-sequence is extracted among symmetrical component data, and a measuring of the distance to the fault point is performed by using the electric quantity of the positive-phase-sequence.

Generally speaking, each impedance value of the transmission line has an asymmetrical relation which differs among the three phases. In addition, each impedance means a self impedance and a mutual impedance.

Therefore, the impedance value set up as the setting value to take an unbalance into consideration is not a positive-phase-sequence impedance. That is, the setting value is set as the impedance value for the three phases.

For example, the line drop voltage in the transmission line is calculated by transforming the data of three-phases as shown in an equation (8) into the electric quantity of the positive-phase-sequence.

$$V_{L1} = \{z_{rr} \cdot I_r + z_{rs} \cdot I_s + z_{rt} \cdot I_t + z_{rr} \cdot I_r + z_{rs} \cdot I_s + z_{rt} \cdot I_t\}_1 \qquad (8)$$

$V_{L1}$: line positive-phase-sequence voltage
z': mutual impedance of adjacent line
I': current of adjacent line
r, s, t: phase
{ }$_1$: positive-phase-sequence transformation It is possible to calculate a line voltage accurately, though the impedance of the transmission line is unbalanceded among three-phases by performing such a calculation.

However, if the unbalance among three-phases about the impedance value is comparatively small, an electromagnetic induction due to other lines as shown in the equation (8) will not be required to be compensated.

Moreover, it is possible that the distance to a fault point is accurately measured by using only the positive-phase-sequence impedance.

Moreover, as a simple correction method for the electromagnetic induction due to other lines, there is also a method to compensate for the electromagnetic induction by using a zero-phase-sequence current from a self-line and/or the adjacent line. This method is generally adopted in a system having a distance relay.

The fault location unit 16 performs the fault location by using the equation (4) or the equation (5) and electricity of all terminals after performing the synchronous correction by the synchronous correction unit 14 and the impedance setting value passed from the setting unit 15.

The output unit 17 outputs a result, that is, the fault location result obtained with the fault location unit 16.

According to this embodiment, even if there are restrictions of the transfer rate, the transmission quantity of the voltage data of the other side terminal set up as a setting value can be held down to a necessary minimum.

Furthermore, even if the sampling synchronization between the quantity of electricity between lines is not taken in advance, the measurement is possible without influence of the remaining voltage of the fault point and a function to select the fault phase.

Although shown as a two-terminal transmission line, the same function and effect occurs for a multi-terminal transmission line having three or more terminals.

Figure 2:
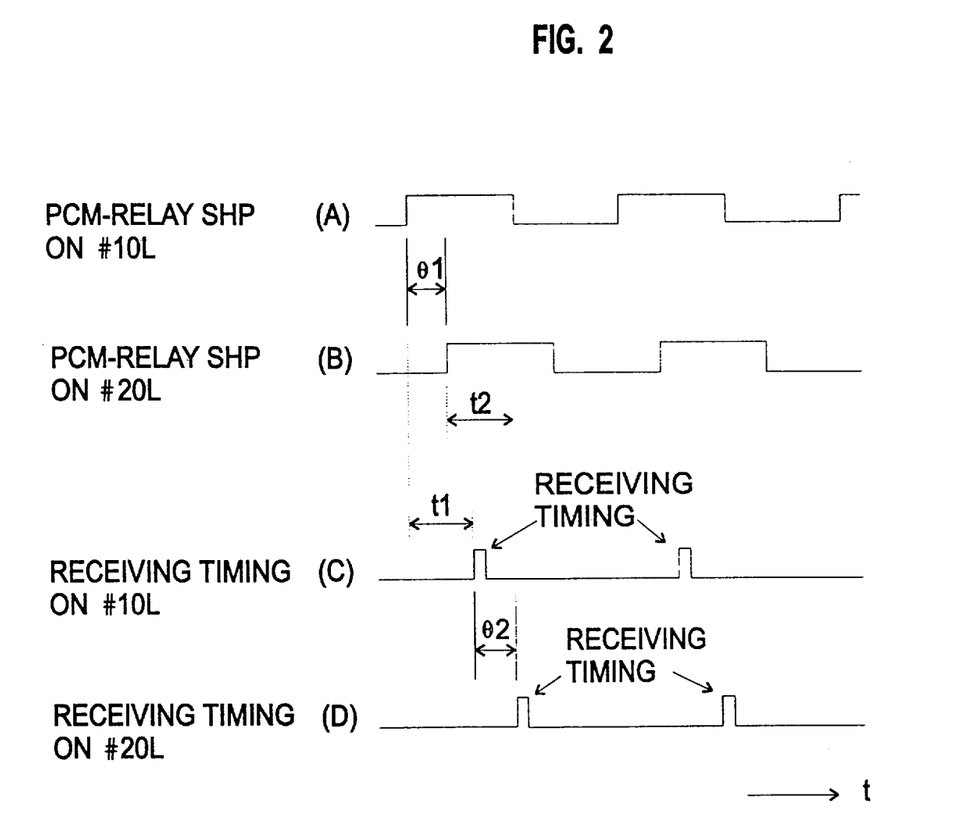
FIG. 2 is a time-chart explaining a second embodiment of a fault locator according to this invention.

FIG. 2 is a time-chart explaining a second embodiment of a fault locator according to this invention.

This embodiment will be explained referring to FIG. 1 and FIG. 2.

In this embodiment, a method of performing a synchronous correction between a quantity of electricity received from a PCM relay 31 A on the line #10L and a quantity of electricity received from a PCM relay 32A on the line #20L is described.

This method is performed as follows.

1) A difference of time delay after a self-terminal transmission signal from each PCM relay (31A, 32A) at an A-terminal (self-terminal) side on the line #10L and the line #20L is transmitted by each one until the time difference that they are received by the fault locator becomes negligible.

2) The transmitting timing of the self-transmission signal of the PCM relays 31A (32A) synchronizes with the sampling signal the corresponding relays 31A (32A).

FIG. 2(A) shows a waveform of a sampling signal (hereinafter referred as SHP) of PCM relays on the line #10L.

FIG. 2(B) shows a waveform of the SHP of PCM relays on the line #20L.

From these waveforms, it is determined that there is a state where there is a timing difference of only "θ1".

Thus, generally, there is a relation with an asynchronous sampling timing between PCM relays on the line #10L and the line #20L.

Moreover, FIG. 2(C) and FIG. 2(D) show a receiving timing for receiving the self-terminal transmission signals from the PCM relay 31A on the line #10L and the PCM relay 32A on the line #20L by the fault locator 1, respectively.

The difference of time delay after the self-terminal transmission signal from the PCM relay 31A on the line #10L and the PCM relay 32A on the line #20L is transmitted until the time difference in receiving the self-terminal transmission signals by the fault locator 1 becomes negligible. That is, the relation t1=t2 in FIG. 2(A) to 2(D) is satisfied.

Also, the transmitting timing of the self-transmission signal of the PCM relays 31A (32A) synchronizes with the sampling signal of the corresponding PCM relays 31A (32A).

Therefore, there is a below-described relation about the sampling timing difference "θ$_1$" between the sampling timing of the PCM relay 31A on the line #10L and the sampling timing of the PCM relay 32A on the line #20L, and the receiving timing differences "θ$_2$" which corresponds the received self-terminal transmission signal from the PCM relays (31A, 32A) by the fault locator 1.

"θ$_1$"="θ$_2$"

Thus, the fault locator 1 measures the receiving timing differences "θ$_2$".

Also, only a phase correction in accordance with θ 2 is performed by the equations (7-1), (7-2) on the basis of at least one of data related to the line #10L and the line #20L.

As a result, the data generated by using the sampling signal of one line is made as a criteria or measure for the other line in which is made to be performed the phase correction.

Although shown as a two-terminal transmission line, the same function and effect occurs for a multi-terminal transmission line having three or more terminals.

FIG. 3(A)–3(E) are time charts explaining a third embodiment of a fault locator according to this invention. This embodiment will be explained referring to FIG. 1 and FIG. 3(A)–3(E).

Figure 3:
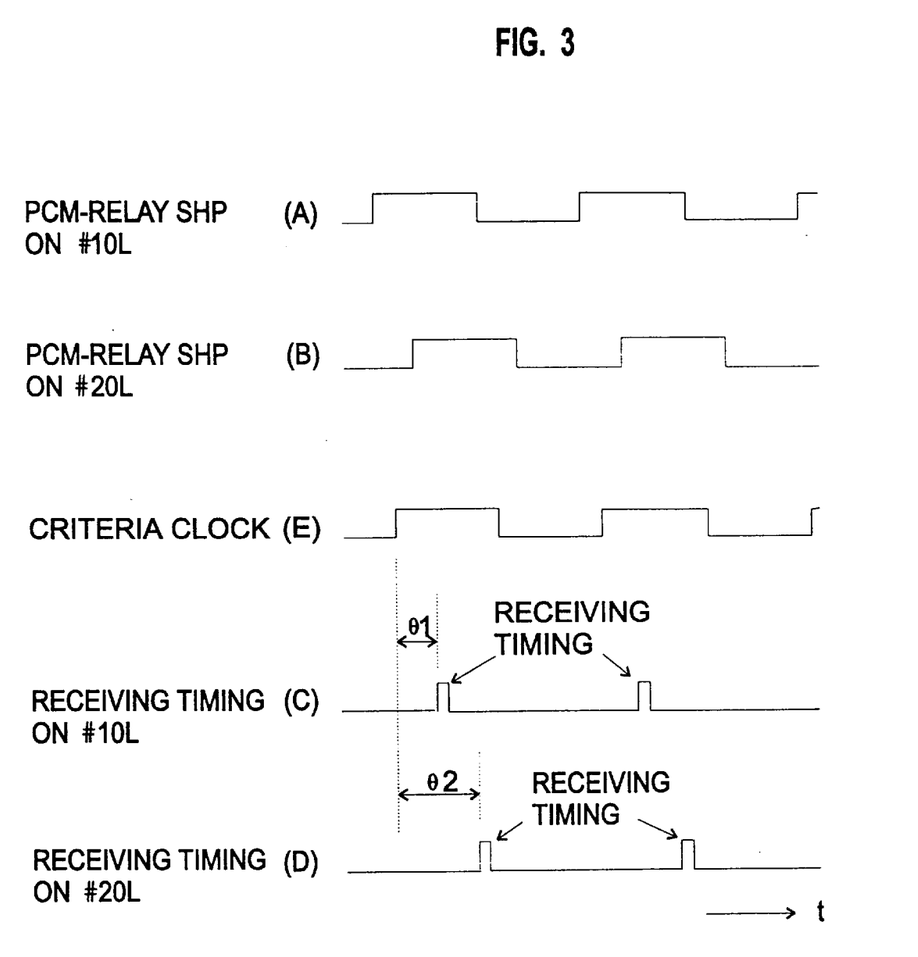
FIG. 3 is a time-chart explaining a third embodiment of a fault locator according to this invention.

This embodiment corresponds to a method in which a synchronous correction between a quantity of electricity received from each PCM relay at an A-terminal (self-terminal) side on the line #10L and the line #20L is performed, similar to the second embodiment. Here, the explanation of the same reference sign in FIG. 2(A)–(D) is omitted.

Therefore, this embodiment is fundamentally the same as that of the second embodiment.

That is, the difference of time delay of the self-terminal transmission signal from the PCM relays (31A, 32A) at the self-terminal side on the line #10L and the line #20L is transmitted until the self-terminal transmission signal that is received by the fault locator 1 becomes negligible.

Also, this embodiment uses the transmitting timing of the self-transmission signal of the PCM relay which synchronizes with the sampling signal of the PCM relay.

In FIG. 3(E), a criteria clock signal is provided with the fault locator 1. The fault locator 1 measures the deviation (θ$_1$, θ$_2$) between the criteria clock and the receiving timing when receiving the self-terminal transmission signals from each PCM relay (31A, 32A) on the line #10L and the line #20L.

By the equations (7-1), (7-2), only θ$_1$ is performed the phase correction to the quantity of electricity received from the PCM relay 31A on the line #10L.

Also, only θ$_2$ is performed the phase correction to the quantity of electricity received from the PCM relay 32A on the line #20L.

By this way, it can be regarded as if each quantity of electricity on the line #10L and the line #20L were sampled by the criteria clock provided with the fault locator 1.

Therefore, the fault locator 1 can perform the fault location by using each compensated quantity of electricity As mentioned above, the criteria clock signal is used as the criteria for determining the fault location in this embodiment.

Also, the deviation is measured of each receiving timing at the time of the fault locator receiving the transmission signal from each PCM relay (31A, 32A) at the self-terminal on the line #10L and the line #20L and the criteria clock.

Furthermore, the quantity of electricity is performed for the phase correction to the quantity of electricity received, and as a result, a synchronous correction function can be provided.

Although shown as a two-terminal transmission line, the same function and effect occur for a multi-terminal transmission line having three or more terminals.

Figure 4:
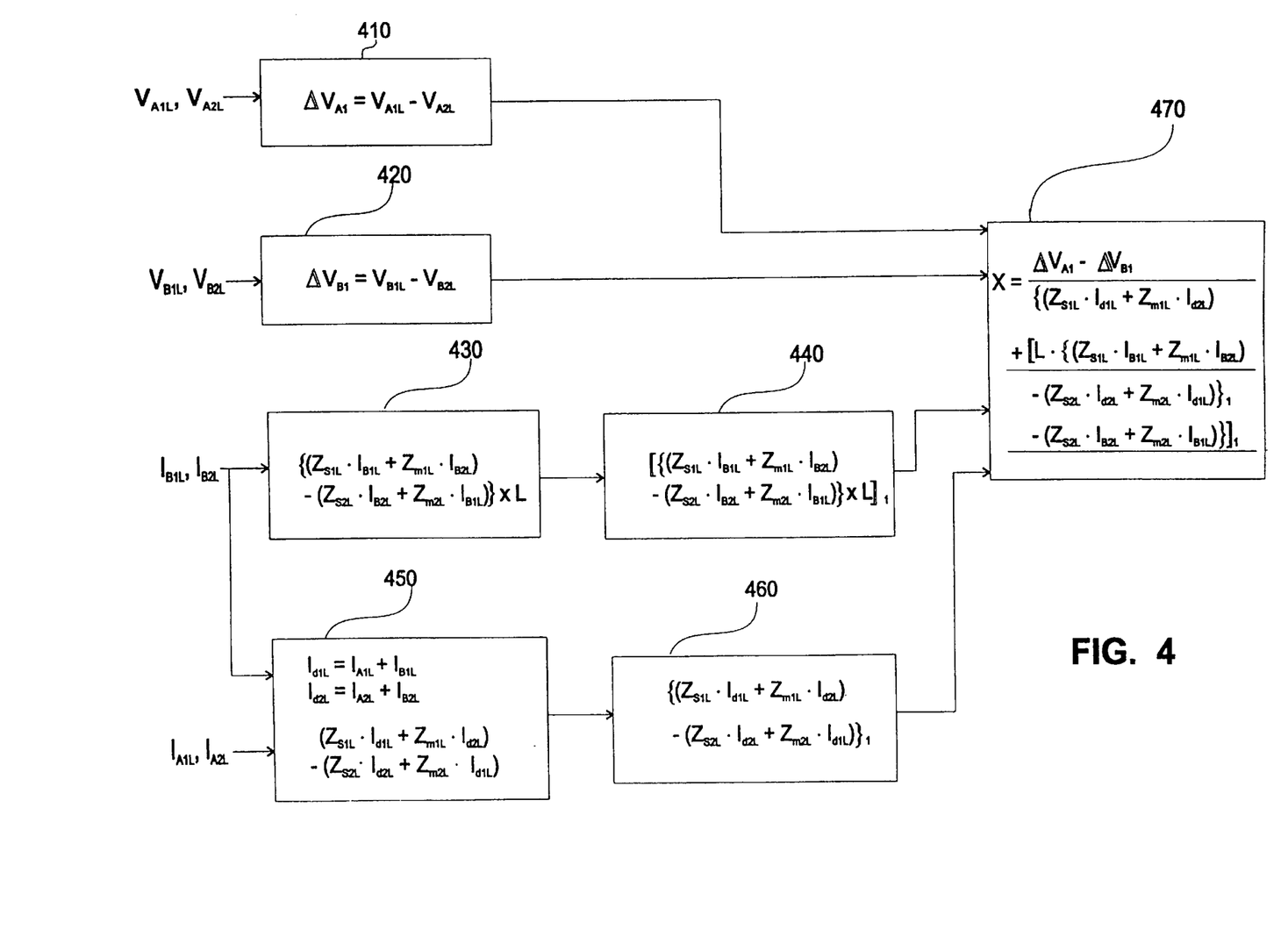
FIG. 4 is a functional block diagram explaining a fourth embodiment of a fault locator according to this invention.

FIG. 4 is a functional block diagram explaining a fourth embodiment of a fault locator according to this invention.

This embodiment will be explained referring to FIG. 1, FIG. 4 and FIG. 5.

In this embodiment, a method of a fault location using a quantity of electricity of all terminals received from each PCM relay (31A, 32A) on a line #10L and a line #20L is shown.

In addition, although shown as a two-terminal parallel transmission line, the same method applies for a multi-terminal parallel transmission line having three or more terminals.

As mentioned above, a positive-phase-sequence quantity of electricity as a symmetrical quantity of electricity has a characteristic to measure a fault point no matter what a fault may be or what the fault is in terms of restrictions about a transmission capacity, without considering a fault phase selection.

The positive-phase-sequence quantity of electricity is one of symmetrical components that include a positive-phase sequence, a negative-phase-sequence and zero-phase-sequence in a method of symmetrical coordinates.

Since the positive-phase-sequence quantity of electricity exists in any fault case, a desired function can be performed without detecting a fault phase. However, the zero-phase-sequence to the positive-phase-sequence is only accompanied with a ground fault. That is, the positive-phase-sequence is not generated by the phase fault.

Moreover, the negative-phase-sequence is generated only by an unbalanced fault. That is, the negative-phase-sequence is not generated when a three-phase fault occurs.

Therefore, it is unsuitable to perform the fault location about the fault point by using the positive-phase-sequence quantity of electricity, without detecting the fault phase.

Even so, if the positive-phase-sequence quantity of electricity is used, as the positive-phase-sequence voltage shown in the equation (9), the fault voltage will not become zero, referring, for example, to "Protection relay engineering", edited by the Institute of Electrical Engineers of Japan, Chapter 3, published on Jul. 20, 1981.

Therefore, fault location by a well-known end fault location method is unsuitable in terms of reliability.

$$\text{three-phase fault } (3\phi S) V_{F1}=0 (V_{rF}=V_{sF}=V_{tF}=0) \quad (9\text{-}1)$$

$$\text{two-phase fault } (2\phi S) V_{F1}=E_{F1}/2 (V_{sF}=V_{tF}=0) \quad (9\text{-}2)$$

$$\text{single-phase ground fault } (1\phi G) - V_{F1} \approx E_{F1}/3 (V_{rF}=0) \quad (9\text{-}3)$$

$$\text{two-phase ground fault } (2\phi G) - V_{F1} \approx E_{F1}/2 (V_{sF}=V_{tF}=0) \quad (9\text{-}4)$$

$E_{F1}$: pre-fault voltage
$V_F$: residual voltage of fault point
r,s,t: three phase
$V_{rF}$: r-phase voltage of fault point
$V_{sF}$: s-phase voltage of fault point
$V_{tF}$: t-phase voltage of fault point
$\approx$: almost equal The positive-phase-sequence voltage at the fault point remains irrespective of the existence of the resistance of the fault, except for the case of the three-phases fault as described above.

As a solution to this problem, the present invention considers a system as not influenced by the positive-phase-sequence voltage at the fault point, and also that the system uses a quantity of electricity of the other side terminal (B-terminal in FIG. 1).

In the case that the fault occurs between an A-terminal and a B-terminal, a relation among the positive-phase-sequence voltage "$V_{A(\ )1}$ and $V_{B(\ )1}$" and the positive-phase-sequence current "$I_{A(\ )1}$ and $I_{B(\ )1}$" and among the positive-phase-sequence voltage of the fault point at the A-terminal and the B-terminal, is shown in the equations below.

Figure 5:
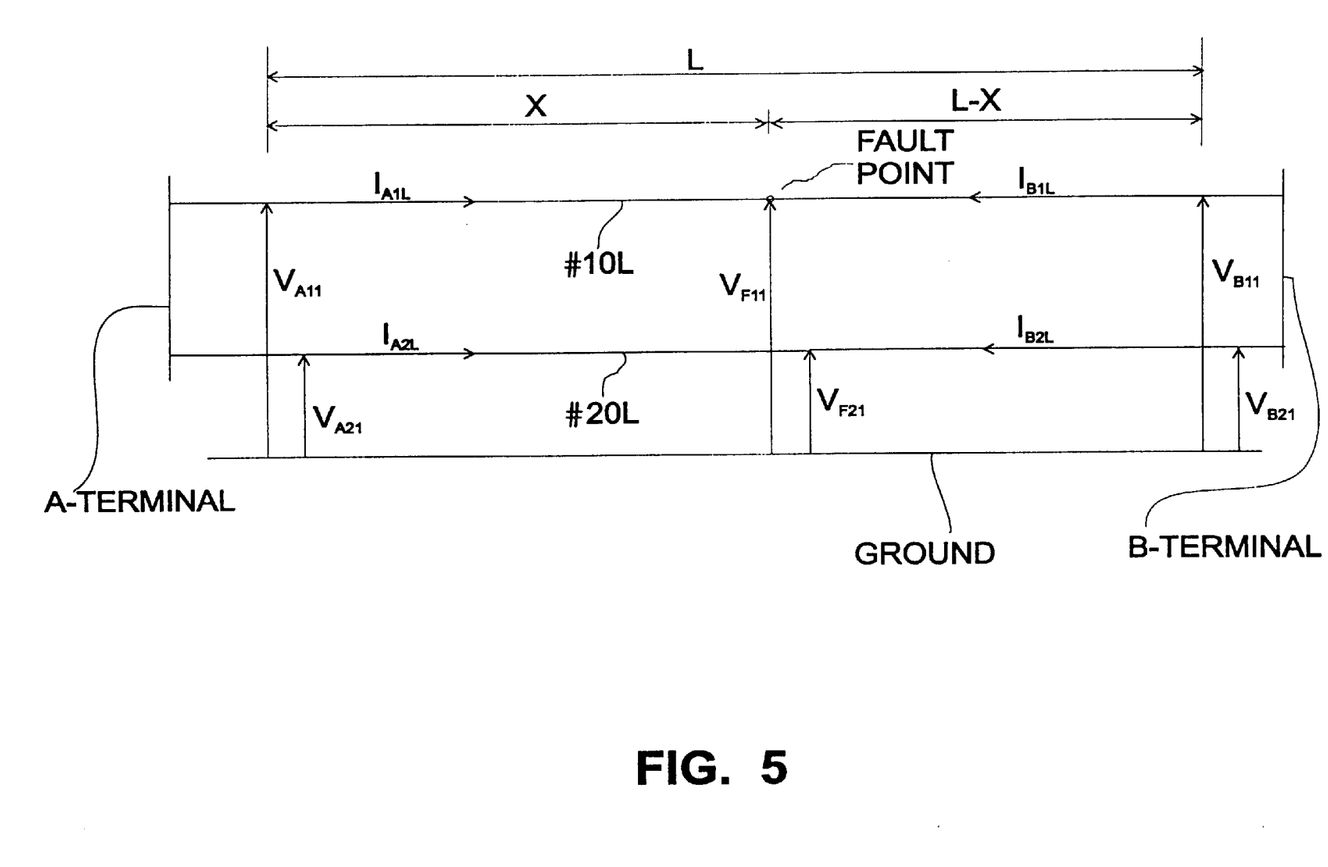
FIG. 5 is a system diagram showing an embodiment of a fault locator according to this invention.

In addition, an explanation of the following equation of this principle is shown in FIG. 5.

$$V_{A11} = X \cdot (Z_{S1L} \cdot I_{A1L} + Z_{m1L} \cdot I_{A2L})_1 + V_{F11}$$

$$V_{B11} = (L-X) \cdot (Z_{S1L} \cdot I_{B1L} + Z_{m1L} \cdot I_{B2L})_1 + V_{F11}$$

$$V_{A21} = X \cdot (Z_{S2L} \cdot I_{A2L} + Z_{m2L} \cdot I_{A1L})_1 + V_{F21}$$

$$V_{B21} = (L-X) \cdot (Z_{S2L} \cdot I_{B2L} + Z_{m2L} \cdot I_{B1L})_1 + V_{F21} \quad (10)$$

$V_{A1L1}$: A-terminal voltage at A-terminal on line #10L
$V_{B1L1}$: B-terminal voltage at A-terminal on line #10L
$V_{A2L1}$: A-terminal voltage at A-terminal on line #20L
$V_{B2L1}$: B-terminal voltage at A-terminal on line #20L
$Z_{S1L}$: line impedance per unit length on line #10L
$Z_{S2L}$: line impedance per unit length on line #20L
$Z_{m1L}$: mutual impedance per unit length in line #10L
$Z_{m2L}$: mutual impedance per unit length in line #20L
$I_{A1L}$: A-terminal current at A-terminal in line #10L
$I_{A2L}$: A-terminal current at A-terminal in line #20L
$I_{B1L}$: B-terminal current at B-terminal in line #10L
$I_{B2L}$: B-terminal current at B-terminal in line #20L
L: line length between A-terminal and B-terminal
X: measurement value (distance from A-terminal to fault point)
$(\ )_1$: positive-phase-sequence transformation
$Z(\ )1L, Z(\ )2L$ are a line impedance per unit length of the line #10L and the line #20L, respectively. If relation between $Z(\ )1L$ and $Z(\ )2L$ is symmetrical, $Z(\ )1L=Z(\ )2L$. Therefore, an equation (11) can be obtained from equation (10), and X can be measured.

$$x = [\Delta V_{A1} - \Delta V_{B1L} + [L \cdot \{(Z_{S1L} \cdot I_{B1L} + Z_{m1L} \cdot I_{B2L}) - (Z_{S2L} \cdot I_{B2L} + Z_{m2L} \cdot I_{B1L})\}_1]]/\{(Z_{S1L} \cdot I_{d1L} + Z_{m1L} \cdot I_{d2L}) - (Z_{S2L} \cdot I_{d2L} + Z_{m2L} \cdot I_{d1L})\}_1 \quad (11)$$

$$\Delta V_{A1} = (V_{A1} - V_{A2})$$

$$\Delta V_{B1} = (V_{B1} - V_{B2})$$

$$I_{d(\ )L} = I_{A(\ )L} + I_{B(\ )L} \text{ (vector sum)}$$

$\{\ \}_1$: positive-phase-sequence transformation

By referring to FIG. 4, the equation (11) will be explained. In FIG. 4, a positive-phase-sequence difference voltage $\Delta V_{A1}$ of the positive-phase-sequence voltage ($V_{A1L}$ and $V_{A2L}$) of each line (#10L, #20L) of the A-terminal side in the parallel transmission line can be obtained in a first computing unit 410.

On the one hand, the positive-phase-sequence difference voltage $\Delta V_{B1}$ of the positive-phase-sequence voltage ($V_{B1L}$ and $V_{B2L}$) of each line (#10L, #20L) of the B-terminal side in the parallel transmission line can be obtained in a second computing unit 420.

In a third computing unit 430, the following relation can be obtained from the below data:
1) a line-length(L), a line-impedance ($Z_{S1L}$, $Z_{S2L}$) of each line (#10L, #20L) between the A-terminal and the B-terminal set in the setting unit 15 (see FIG. 1).
2) a mutual impedance ($Z_{m1L}$, $Z_{m2L}$) from an adjacent line $$\{(Z_{S1L}\cdot I_{B1L}+Z_{m1L}\cdot I_{B2L})-(Z_{S2L}\cdot I_{B2L}+Z_{m2L}\cdot I_{B1L})\}\times L$$

L: line length between A-terminal and B-terminal

In a fourth computing unit 440, the positive-phase-sequence voltage (below shown) is obtained by performing the positive-phase-sequence transformation ($[\ ]_1$).

$$\text{the positive-phase-sequence voltage}=[\{(Z_{S1L}\cdot I_{B1L}+Z_{m1L}\cdot I_{B2L})-(Z_{S2L}\cdot I_{B2L}+Z_{m2L}\cdot I_{B1L})\}\times L]_1$$

In a fifth computing unit 450, "$(Z_{S1L}\cdot I_{d1L}+Z_{m1L}\cdot I_{d2L})-(Z_{S2L}\cdot I_{d2L}+Z_{m2L}\cdot I_{d1L})$", which is a quantity of three-phase voltage drop per unit length of each line (#10L, #20L), is calculated In a sixth computing unit 460, $\{(Z_{S1L}\cdot I_{d1L}+Z_{m1L}\cdot I_{d2L})-(Z_{S2L}\cdot I_{d2L}+Z_{m2L}\cdot I_{d1L})\}_1$ which is the positive-phase-sequence voltage, is obtained from the three-phase voltage value in the third computing unit 430 by performing the positive-phase-sequence transformation ($\{\ \}_1$).

In a seventh computing unit 470, the distance to the fault point is computed by the equation (11) according to each data obtained by the first to sixth elements in FIG. 4.

Each of the computing units shown in FIG. 4 may be performed in software, hardware, or a combination of software and hardware.

According to this embodiment, in the parallel transmission line configuration, it determines that the difference voltage between each terminal voltage of the line #10L and the line #20L is almost 0, the error produced based on the magnitude of each terminal voltage by using the difference quantity of the positive-phase-sequence quantity of the line is mitigated, and the distance to the fault point is computed correctly.

In addition, although shown as a two-terminal parallel transmission line, the same function and effect occur for a multi-terminal parallel transmission line having three or more terminals.

Figure 6:
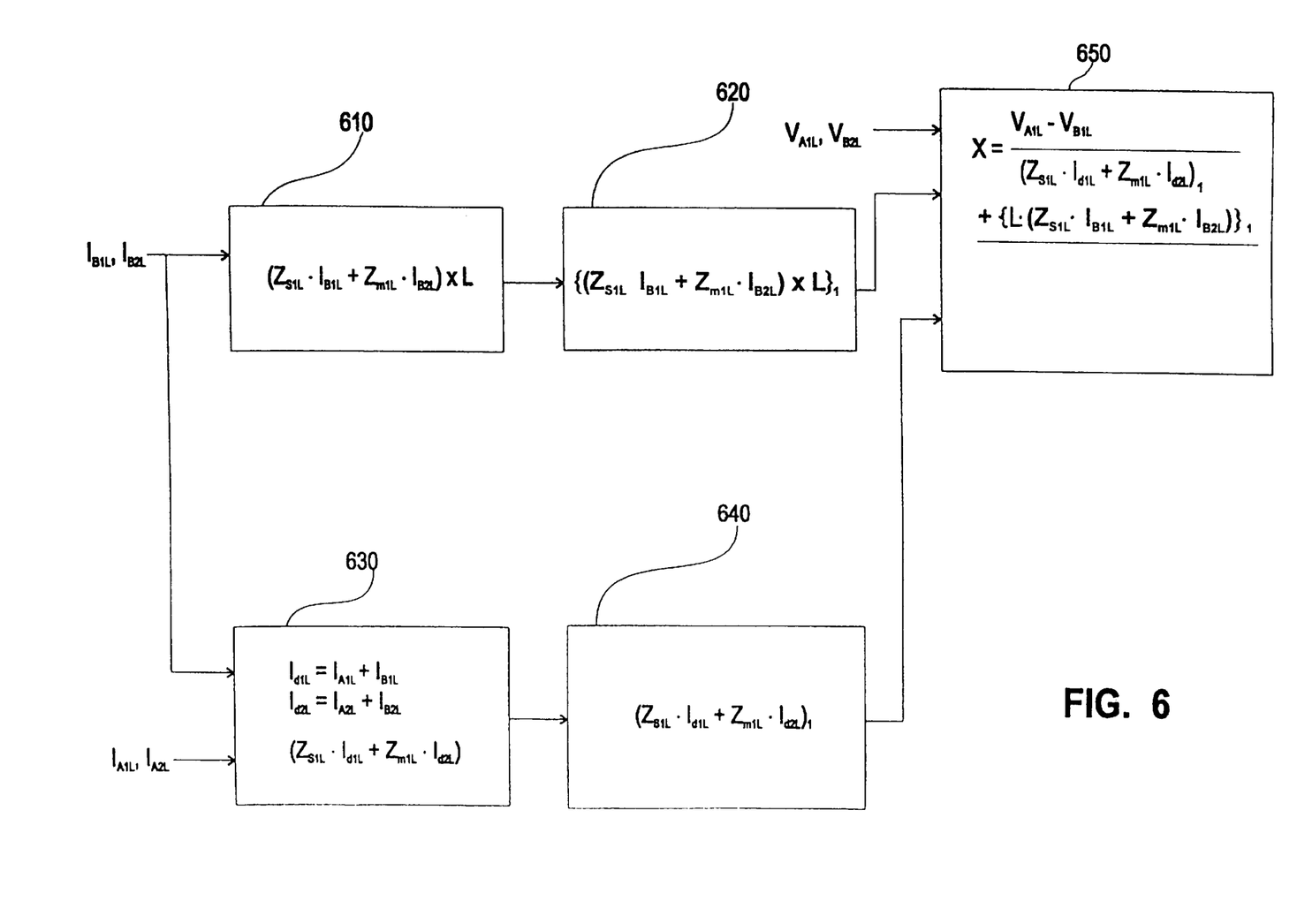
FIG. 6 is a functional block diagram explaining a fifth embodiment of a fault locator according to this invention.

FIG. 6 is a figure explaining a fifth embodiment of a fault locator according to this invention.

This embodiment will be explained referring to FIG. 1, FIG. 5 and FIG. 6.

This embodiment perform a fault location by using a data of a quantity of electricity of all terminals, which are received from the quantity of electricity in each line (#10L, #20L). In addition, this embodiment will be explained in the case of the transmission line having two terminals, but it is equally applicable to a case having more than two terminals.

By adopting an equation (12) for determining a fault line, a distance to a fault point can be calculated regardless of an operation state of an adjacent line, and a measurement value (that is, a distance to a fault point) can be calculated by applying that equation. However, equation (12) is directed only to the fault line.

$$x=[V_{A1}-V_{B1}+\{L\cdot(Z_{S1L}\cdot I_{B1L}+Z_{m1L}\cdot I_{B2L})\}_1]/(Z_{S1L}\cdot I_{d1L}+Z_{m1L}\cdot I_{d2L})_1 \quad (13)$$

By referring to FIG. 6, a detailed explanation will be provided below.

In a first computing unit 610, $(Z_{S1L}\cdot I_{B1L}+Z_{m1L}\cdot I_{B2L})\times L$ is obtained from data described below.
1) line-length(L) and line-impedance ($Z_{S1L}, Z_{S2L}$) of each line (#10L, #20L) between an A-terminal and a B-terminal in the setting unit 15 (see FIG. 1).
2) mutual impedance ($Z_{m1L}, Z_{m2L}$) from an adjacent line In a second computing unit 620, $\{(Z_{S1L}\cdot I_{B1L}+Z_{m1L}\cdot I_{B2L})\times L\}_1$, which is a positive-phase-sequence voltage, is obtained from a three-phase voltage value obtained by the first computing unit 610 by performing the positive-phase-sequence transformation ($\{\ \}_1$).

In a third computing unit 630, $(Z_{S1L}\cdot I_{d1L}+Z_{m1L}\cdot I_{d2L})$, which is the three-phase drop voltage per unit length of the parallel transmission line by an influence of the fault current, is determined from data described below.
1) line-length(L) and line-impedance ($Z_{S1L}, Z_{S2L}$) of each line (#10L, #20L) between the A-terminal and the B-terminal set in the setting unit 15 (see FIG. 1).
2) mutual impedance ($Z_{m1L}, Z_{m2L}$) from the adjacent line In a fourth computing unit 640, $(Z_{S1L}\cdot I_{d1L}+Z_{m1L}\cdot I_{d2L})_1$, which is the positive-phase-sequence voltage, is obtained from the three-phase voltage value in the third computing unit 630 by performing the positive-phase-sequence transformation ($(\ )_1$).

In a fifth computing unit 650, the distance to the fault point can be computed in the equation (13) based on each data by the first through fourth computing units.

Each of the computing units shown in FIG. 6 may be performed in software, hardware, or a combination of software and hardware.

According to this embodiment, the fault locator, which can measure the distance to the fault point correctly, is provided, regardless of the operation state of the adjacent line in the parallel transmission line.

In addition, although shown as a two-terminal parallel transmission line, the same function and effect occur for a multi-terminal parallel transmission line having three or more terminals.

Figure 7:
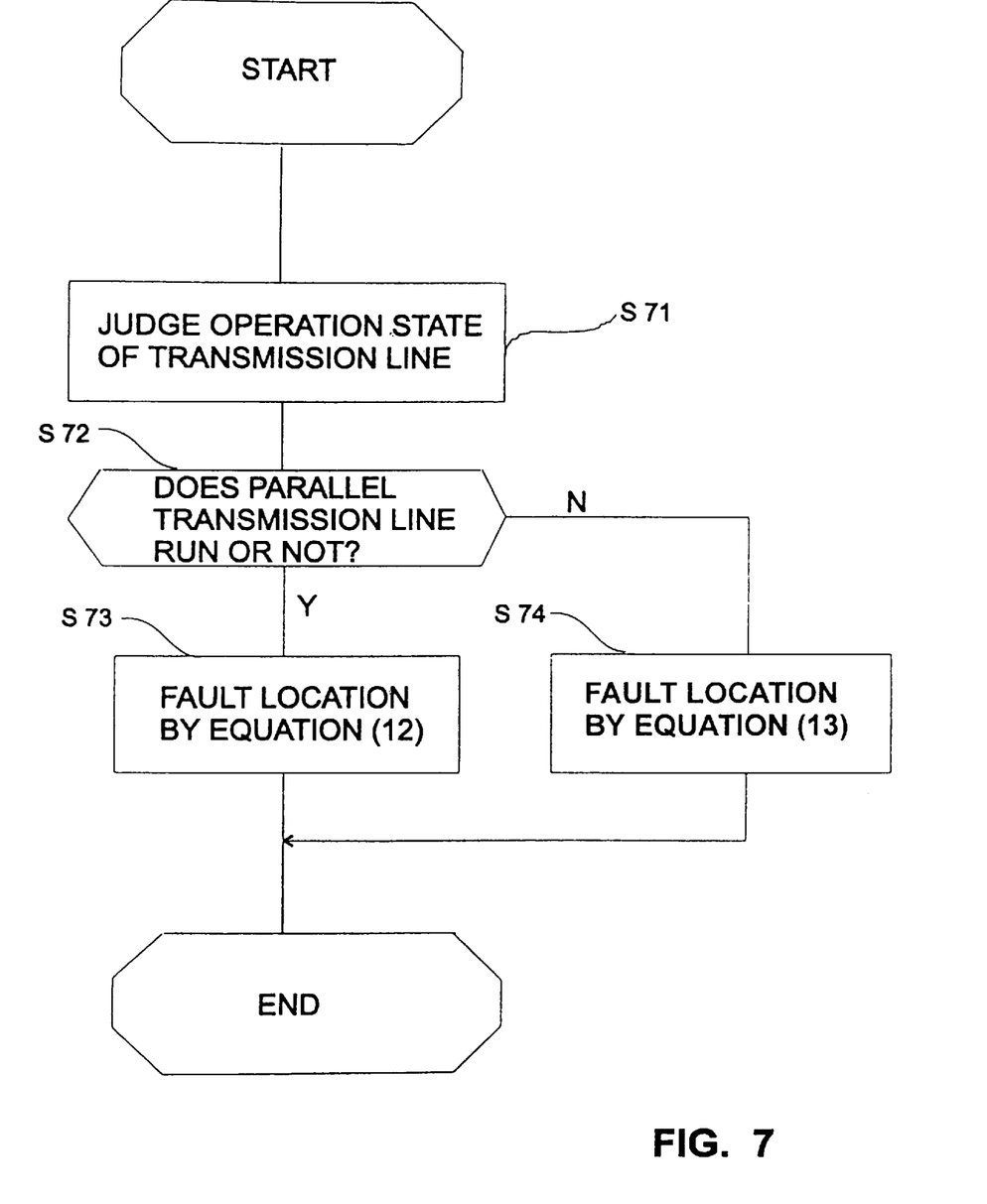
FIG. 7 is a flowchart showing a processing of a sixth embodiment of a fault locator according to this invention.

FIG. 7 is a flowchart explaining a sixth embodiment of a fault locator method according to this invention.

This embodiment will be explained referring to FIG. 1, FIG. 4, FIG. 5, FIG. 6 and FIG. 7.

By using the equation (13), a fault location can be performed, regardless of an operation state of an adjacent line. That is, this embodiment offers a fault locator to perform an optimum fault location by confirming a state of a circuit breaker of all terminals when a fault occurs.

By referring to FIG. 7, this embodiment will be explained below.

Step S71 judges the operation state of a parallel transmission line with reference to the information of a circuit breaker provided with each terminal (A-terminal and B-terminal).

When the parallel transmission line (#10L, #20L) is operating (run), Step S72 progresses to Step S73 which applies the equation (12), by the result of Step S71.

On the one hand, when only a single line of the parallel transmission line is operating (for example, line #10L or line #20L is only operating), Step S72 progresses to Step S74 which applies equation (13) and the fault location will be performed.

By performing fault location in this manner, a fault locator which can perform the fault location by using an optimum equation in accordance with the operation state of the transmission line can be obtained.

As mentioned above, the above-described embodiments perform the fault location based on the data which is performed through the positive-phase-sequence conversion. Therefore, accuracy can improve the fault location of the fault point by quantity of electricity of a minimum necessary, without sorting the fault phase.

In addition, although shown as a two-terminal parallel transmission line, the same function and effect occur for a multi-terminal parallel transmission line having three or more terminals.

Further, in the embodiments, as way to get electrical data of all terminals on the parallel transmission, the PCM relay, which is a kind of current differential relay, is used in the embodiments. These embodiments are not limited to the PCM relay. Other ways of getting electrical data for all terminals on the parallel transmission can also be applied to the invention, in place of the limit the PCM relay. In addition, though these embodiments are explained with respect to a PCM relay based on sampling time system, a PCM relay based on a PHASER system (amplitude/phase information transmission system) can be applied to this invention.

As mentioned-above, in the above-described embodiments, each embodiment is explained while referring to the two-terminal parallel transmission line. However, the invention can be applied to a multi-terminal parallel transmission line.

The invention may be embodied in other specific forms without departing from the spirit or essential characteristics thereof. The present embodiments are thereof to be considered in all respects as illustrative and not restrictive, the scope of the invention being indicated by the appended claims rather than by the foregoing description and all changes which come within the meaning and range of equivalency of the claims are therefore intended to be embraced therein.

Japanese priority Application No. PH11-12025, filed on Jan. 20, 1999, including the specification, drawings, climes and abstract, is hereby incorporated by reference.

What is claimed is:

1. A fault locator provided adjacent to a first terminal for performing fault location on a parallel transmission line comprising a first line and a second line having a terminal at both sides, based on status of the parallel transmission line through a current differential relay provided with the terminals at both sides of said first line and said second line, comprising:
   a data receiving unit for receiving a transmission signal and a reception signal from said current differential relay provided with said first terminal of said terminals at both sides, measuring a receiving timing of said transmission signal from said current differential relay provided with said first terminal, wherein said transmission signal and said reception signal each includes said status of the parallel transmission line;
   a fault detecting unit for detecting a fault on said first line and said second line based on electrical data that includes said status of the parallel transmission line and said receiving timing from said data receiving unit, said fault detecting unit outputting a start signal when said fault is detected;
   a data memory unit for storing and updating said electrical data of said first line and said second line from said data receiving unit, storing said electrical data related to said fault when said start signal is outputted from said fault detecting unit, wherein said electrical data is related to said first terminal and an other side terminal that corresponds to a second terminal of said first line and said second line;
   a synchronous correction unit for performing a synchronous correction processing to said electrical data stored when said start signal is outputted, based on information on said receiving timing of said transmission signal from said data receiving unit;
   a setting unit for setting an impedance value of three-phases and a line-length of said first line and said second line as a setting value;
   a fault location unit for performing a fault location by using said electrical data after said synchronous correction processing by said synchronous correction unit, said impedance value of three-phases, and said line-length by said setting unit, wherein a measurement value obtained as a result corresponds to a distance to a fault point; and
   an output unit for outputting the measurement value.

2. A fault locator according to claim 1,
   wherein said current differential relay is a Pulse Code Modulation relay.

3. A fault locator according to claim 1,
   wherein said data receiving unit measures a receiving timing difference between a receiving time from said first line and a receiving time from said second line at said first terminal when said transmission signal from said current differential relay is received;
   wherein said synchronous correction unit performs said synchronous correction processing on a basis of either one of said first line and said second line, and performs a phase correction processing to said electrical data in accordance with said receiving timing difference obtained by said data receiving unit when said transmission signal from said current differential relay is received.

4. A fault locator according to claim 3,
   wherein said current differential relay is a Pulse Code Modulation relay.

5. A fault locator according to claim 1,
   wherein said data receiving unit includes a criteria clock signal unit which outputs a criteria signal at a predetermined interval, said data receiving unit measuring a deviation between said criteria signal and a receiving timing from said first line and a deviation between said criteria signal and a receiving timing from said second line when said transmission signal from said current differential relay is received;
   wherein said synchronous correction unit performs said synchronous correction processing on a basis of either one of said first line and said second line, and performs a phase correction processing to said electric data in accordance with said deviation obtained by said data receiving unit when said transmission signal from said current differential relay is received.

6. A fault locator according to claim 5,
   wherein said current differential relay is a Pulse Code Modulation relay.

7. A fault locator according to claim 1,
   wherein said fault location unit comprises:
   a first unit for calculating a difference between a positive-phase-sequence voltage of said first line and between a positive-phase-sequence voltage of said second line at said first terminal, in accordance with following equations;

$$\Delta V_{A1} = V_{A1L} - V_{A2L} \quad (5)$$

$V_{A1L}$: a positive-phase-sequence voltage of said first line at said first terminal, $V_{A2L}$: a positive-phase-sequence voltage of said second line at said first terminal, a second unit for calculating a difference between a positive-phase-sequence voltage of said first line and between a positive-phase-sequence voltage of said second line at said second terminal, in accordance with following equations;

$$\Delta V_{B1} = V_{B1L} - V_{B2L}$$

$V_{B1L}$: a positive-phase-sequence voltage of said first line at said second terminal, $V_{B2L}$: a positive-phase-sequence voltage of said second line at said second terminal, a third unit for calculating a three-phase voltage, in accordance with following equations;

a three-phase voltage = $\{(Z_{S1L} \cdot I_{B1L} + Z_{m1L} \cdot I_{B2L}) - (Z_{S2L} \cdot I_{B2L} + Z_{m2L} \cdot I_{B1L})\} \times L$ L: length of line, $Z_{S1L}$: first line, line impedance per unit length of L, $Z_{S2L}$: second line, line impedance per unit length of L, $Z_{m1L}$: first line, mutual impedance per unit length of L, $Z_{m2L}$: second line, mutual impedance per unit length of L, $I_{B1L}$: first line, three-phase current at said first terminal, $I_{B2L}$: second line, three-phase current at said first terminal, a fourth unit for calculating a positive-phase-sequence voltage from said three-phase voltage obtained by said third unit, in accordance with following equations;

a positive-phase-sequence voltage = $[\{(Z_{S1L} \cdot I_{B1L} + Z_{m1L} \cdot I_{B2L}) - (Z_{S2L} \cdot I_{B2L} + Z_{m2L} \cdot I_{B1L})\} \times L]_1$, $[\ ]_1$: positive-phase-sequence transformation, a fifth unit for calculating a three-phase voltage difference, in accordance with following equations;

a three-phase voltage difference = $\{(Z_{S1L} \cdot I_{d1L} + Z_{m1L} \cdot I_{d2L}) - (Z_{S2L} \cdot I_{d2L} + Z_{m2L} \cdot I_{d1L})\}$, $I_{d1L} = I_{A1L} + I_{B1L}$ (vector sum), $I_{d2L} = I_{A2L} + I_{B2L}$ (vector sum), a sixth unit for calculating a positive-phase-sequence voltage from said three-phase voltage obtained by said fifth unit, in accordance with following equation;

a positive-phase-sequence voltage = $[(Z_{S1L} \cdot I_{d1L} + Z_{m1L} \cdot I_{d2L}) - (Z_{S2L} \cdot I_{d2L} + Z_{m2L} \cdot I_{d1L})]_1$, and a seventh unit for calculating a distance to a fault point, in accordance with following equation;

a distance = $\{\Delta V_{A1} - \Delta V_{B1} + [\{(Z_{S1L} \cdot I_{B1L} + Z_{m1L} \cdot I_{B2L}) - (Z_{S2L} \cdot I_{B2L} + Z_{m2L} \cdot I_{B1L})\} \times L]_1\} / [(Z_{S1L} \cdot I_{d1L} + Z_{m1L} \cdot I_{d2L}) - (Z_{S2L} \cdot I_{d2L} + Z_{m2L} \cdot I_{d1L})]_1$.

8. A fault locator according to claim 7, wherein said fault location unit perform a fault location by regarding a positive-phase-sequence voltage of a line with no fault as zero.

9. A fault locator according to claim 7, wherein said current differential relay is a Pulse Code Modulation relay.

10. A fault locator according to claim 1, wherein said fault location unit performs said fault location according to calculation by said first through seventh unit when a fault occurs while said first line and said second line are operating, and performs said fault location by regarding a positive-phase-sequence voltage of a line as zero when at least one said first line and said second line are not operating.

* * * * *